United States Patent
Hsiao et al.

(10) Patent No.: US 12,342,633 B2
(45) Date of Patent: Jun. 24, 2025

(54) PHOTOVOLTAIC PANEL PACKAGING STRUCTURE AND METHOD FOR THE SAME

(71) Applicants: A SUN DRAGON ENERGY CO., LTD., New Taipei (TW); PU TIEN INVESTMENT CO., LTD., Kaohsiung (TW)

(72) Inventors: Yao-Chung Hsiao, Taoyuan (TW); Hui-Yun Wu, Taichung (TW); Hung-Chun Wang, New Taipei (TW); Yu-Sheng Kuo, Kaohsiung (TW)

(73) Assignees: A SUN DRAGON ENERGY CO., LTD., New Taipei (TW); PU TIEN INVESTMENT CO., LTD., Kaohsiung (TW)

( * ) Notice: Subject to any disclaimer, the term of this patent is extended or adjusted under 35 U.S.C. 154(b) by 0 days.

(21) Appl. No.: 18/353,158

(22) Filed: Jul. 17, 2023

(65) Prior Publication Data

US 2024/0363779 A1    Oct. 31, 2024

(30) Foreign Application Priority Data

Apr. 25, 2023   (TW) .................. 112115395

(51) Int. Cl.
*H10F 19/80*      (2025.01)
*H10F 19/85*      (2025.01)
*H10F 77/42*      (2025.01)

(52) U.S. Cl.
CPC .......... *H10F 19/804* (2025.01); *H10F 19/85* (2025.01); *H10F 77/488* (2025.01)

(58) Field of Classification Search
CPC ............... H01L 31/048; H01L 31/0481; H01L 31/0488
See application file for complete search history.

(56) References Cited

U.S. PATENT DOCUMENTS

2016/0197218 A1 * 7/2016 Itami ................ H02S 30/10
                                                            136/251
2016/0284903 A1   9/2016 Huang et al.
                        (Continued)

FOREIGN PATENT DOCUMENTS

CN    105140325 A  * 12/2015
CN    205407716 U  *  7/2016
                        (Continued)

OTHER PUBLICATIONS

English machine translation of Han(CN-205407716-U) provided by the EPO website, All Pages, 2024. (Year: 2024).*
(Continued)

*Primary Examiner* — Daniel P Malley, Jr.
(74) *Attorney, Agent, or Firm* — Chun-Ming Shih; LANWAY IPR SERVICES

(57) ABSTRACT

The present invention provides a photovoltaic panel packaging structure and method for the same. The packaging structure comprises a frame and a solar photovoltaic panel. The solar photovoltaic panel includes a first frame surface and a second frame surface with a receiving space and grooves formed therein. The a solar photovoltaic panel is installed in the receiving space and stacked on top of a first stop portion. The solar photovoltaic panel includes a first encapsulating layer, a second encapsulating layer. The first encapsulating layer includes a plurality of engaging strips extending along the edges of the solar photovoltaic panel, the engaging strips are respectively embedded in the corresponding grooves to hold the solar photovoltaic panel in place in the frame. Meanwhile, a third encapsulating layer extends to connect to the second frame surface. As a result, weight and thickness can be reduced while reducing multiple packaging passes and simplifying the assembly process.

11 Claims, 7 Drawing Sheets

(56) References Cited

U.S. PATENT DOCUMENTS

| | | |
|---|---|---|
| 2017/0117420 A1 | 4/2017 | Huang et al. |
| 2017/0117427 A1 | 4/2017 | Huang et al. |
| 2018/0212556 A1* | 7/2018 | Wegert .................. H01L 31/048 |
| 2021/0111288 A1 | 4/2021 | Liao et al. |

FOREIGN PATENT DOCUMENTS

| | | | |
|---|---|---|---|
| CN | 209526099 U | * | 10/2019 |
| TW | M490116 U | | 11/2014 |
| TW | 201526269 A | | 7/2015 |
| TW | I612684 B | | 1/2018 |
| TW | I707773 B | | 10/2020 |
| WO | WO-2019037837 A1 | * | 2/2019 |

OTHER PUBLICATIONS

English machine translation of Gao (CN-105140325-A) provided by the EPO website, All Pages, 2024. (Year: 2024).*
English machine translation of Chen (CN-209526099-U) provided by the EPO website, All Pages, 2024. (Year: 2024).*

* cited by examiner

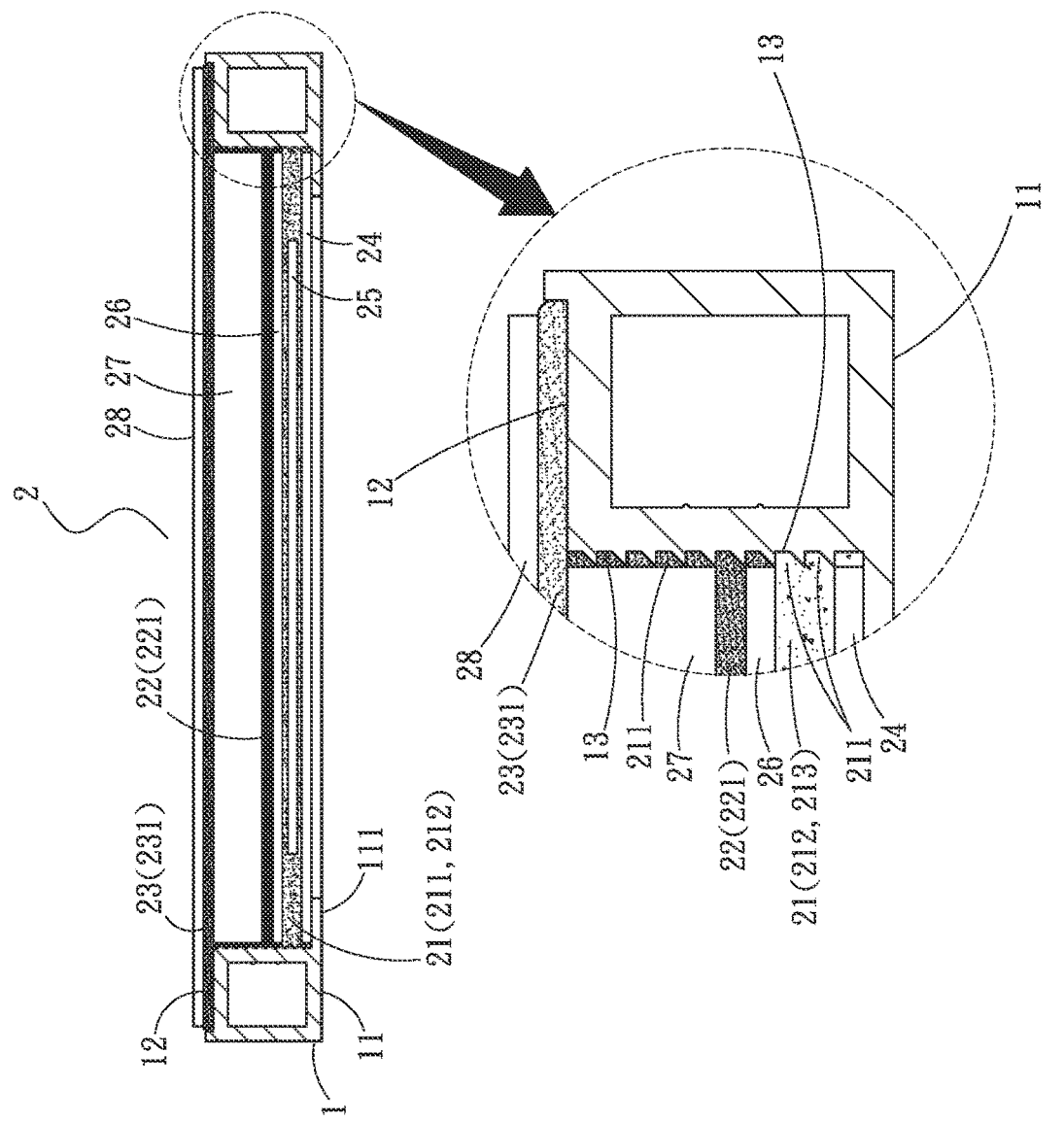
(Fig 1)

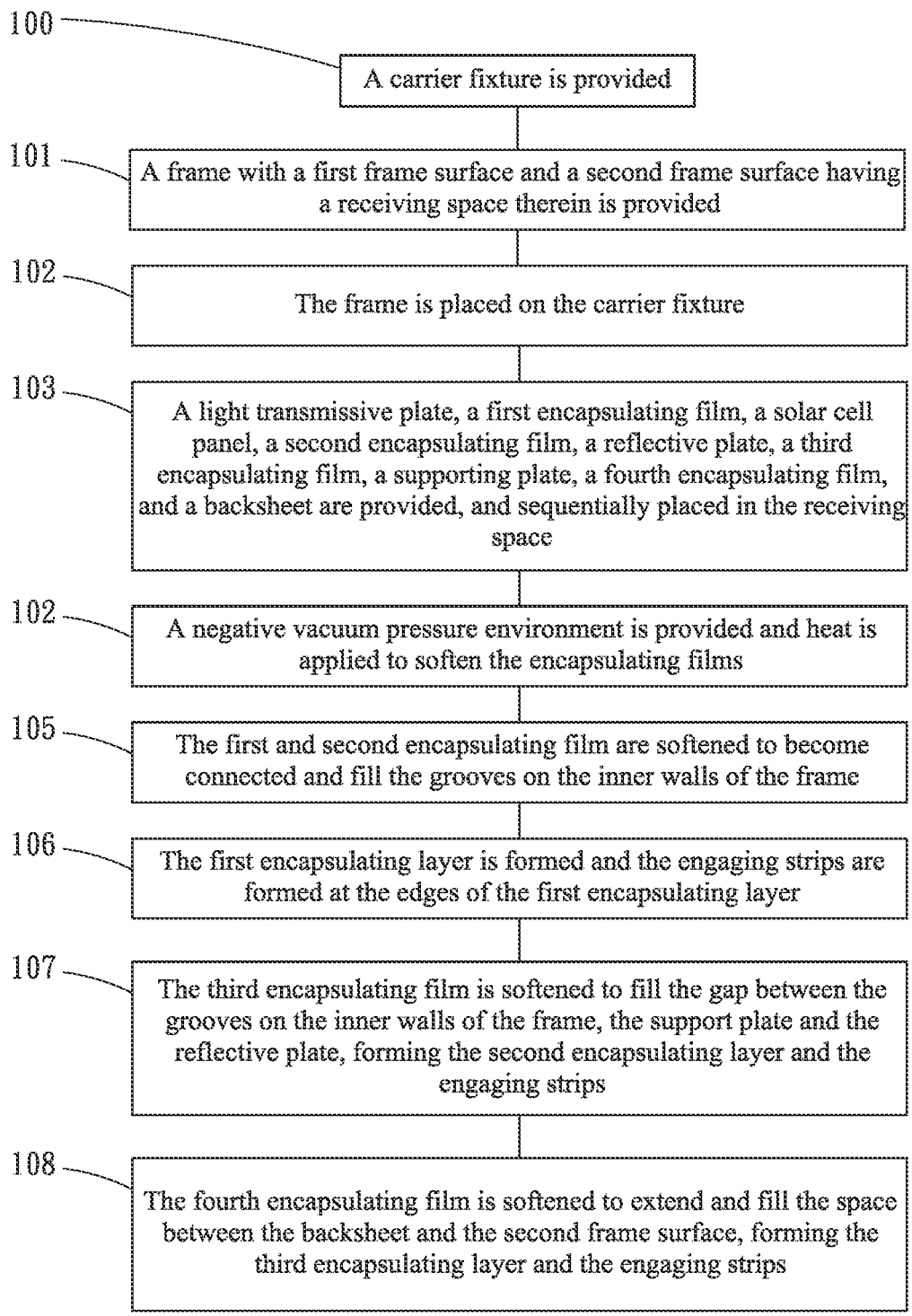
[Fig 2]

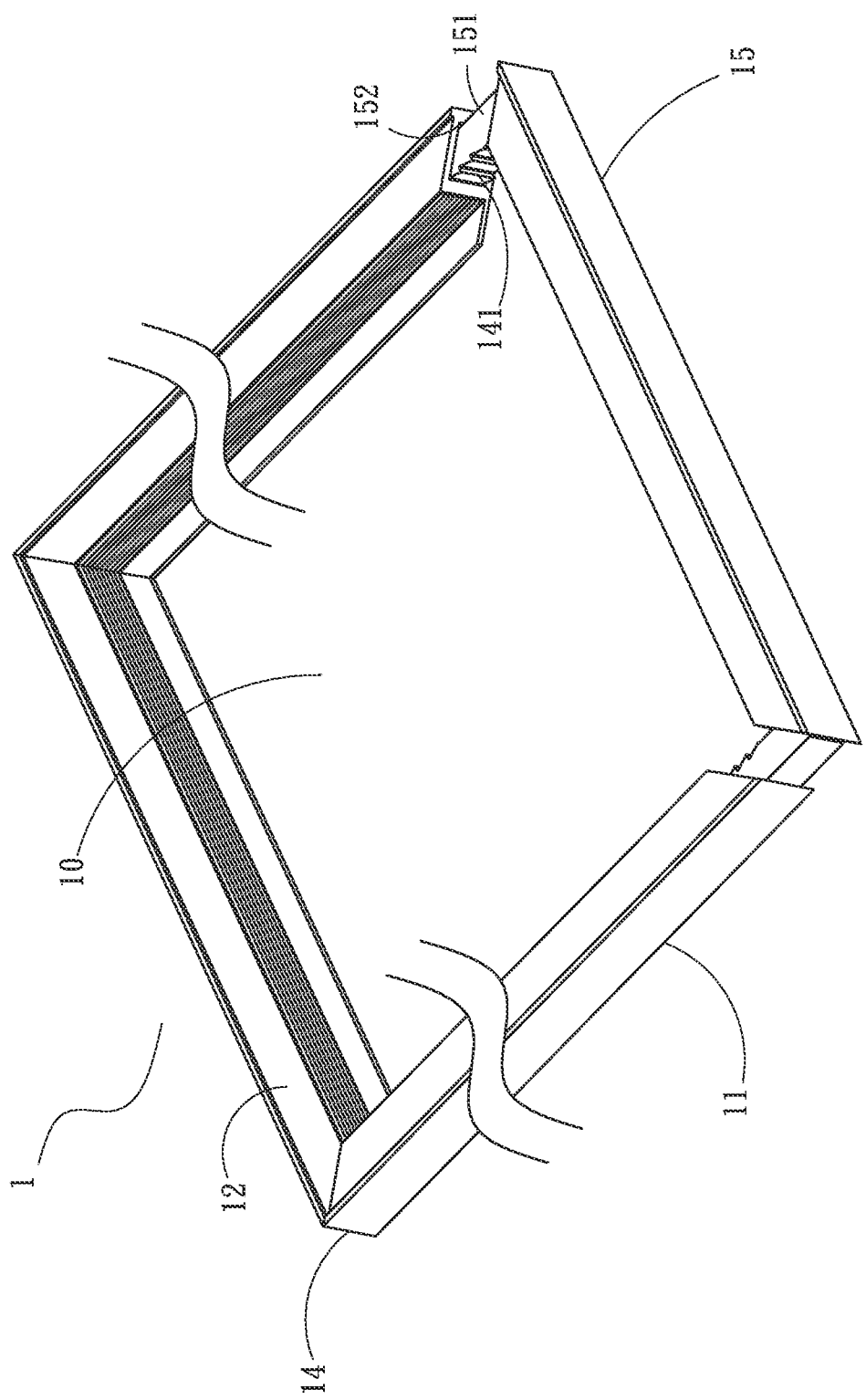

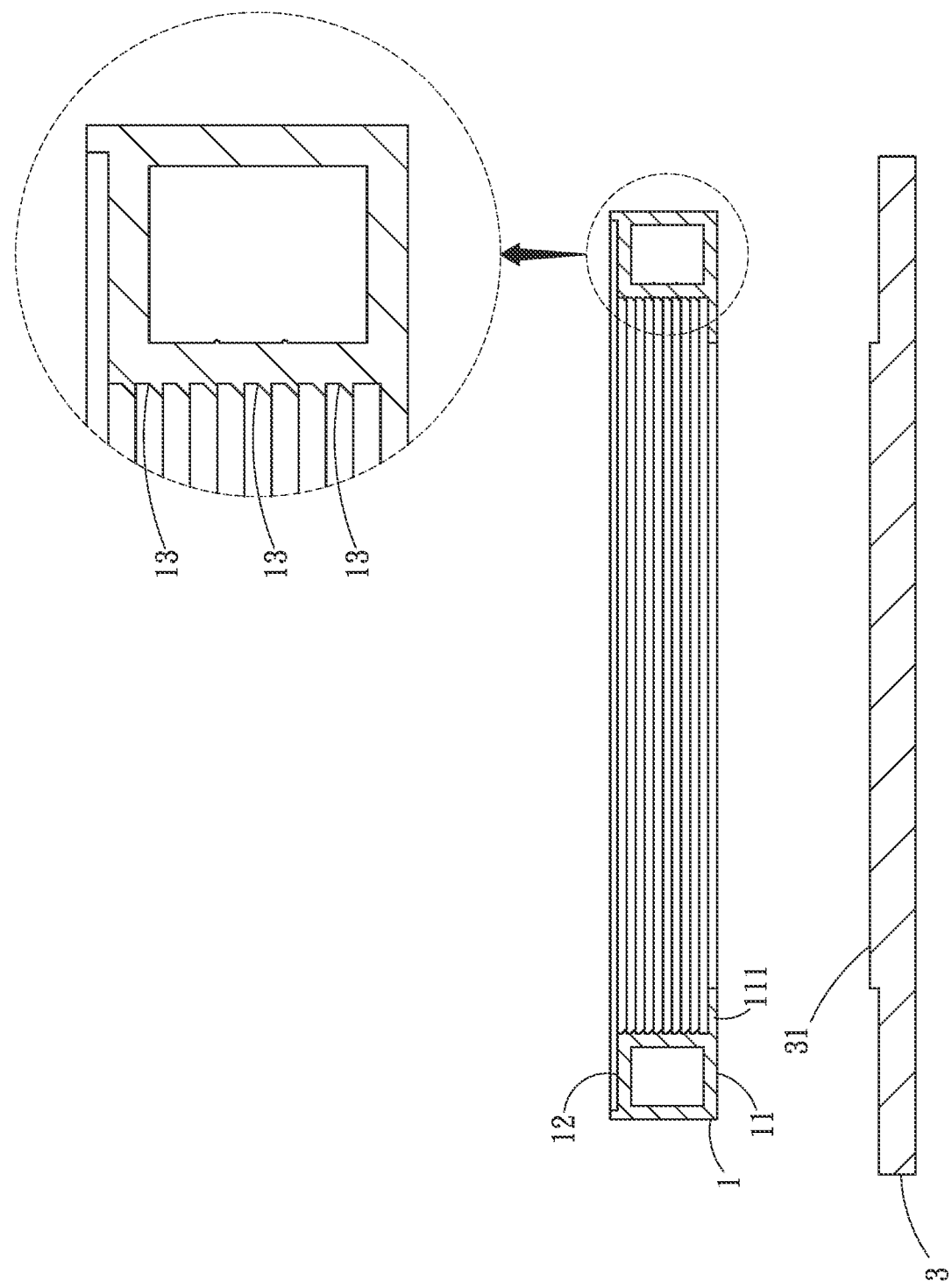

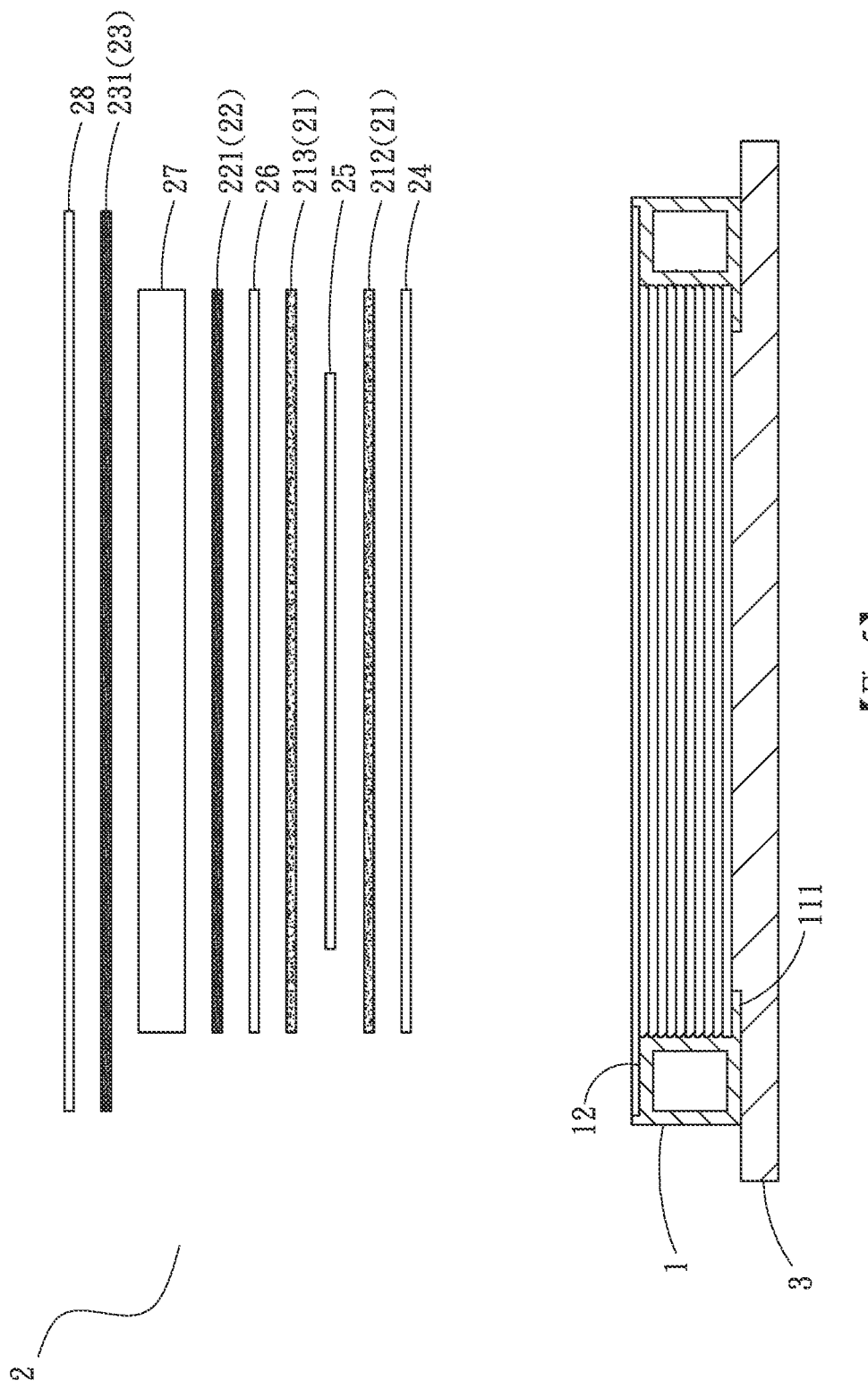
(Fig 5)

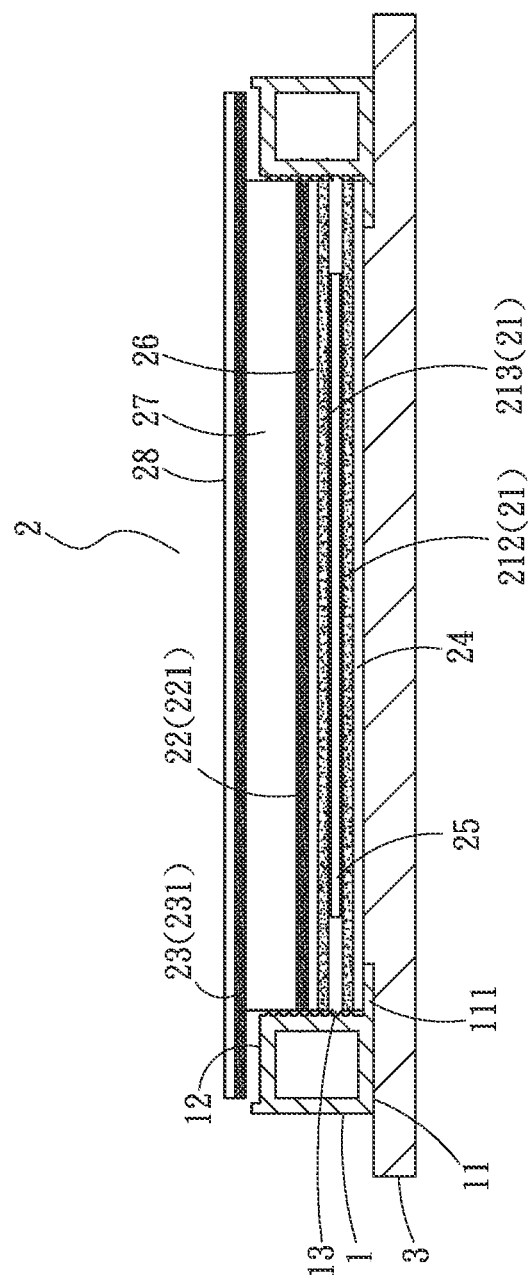
[Fig 6]

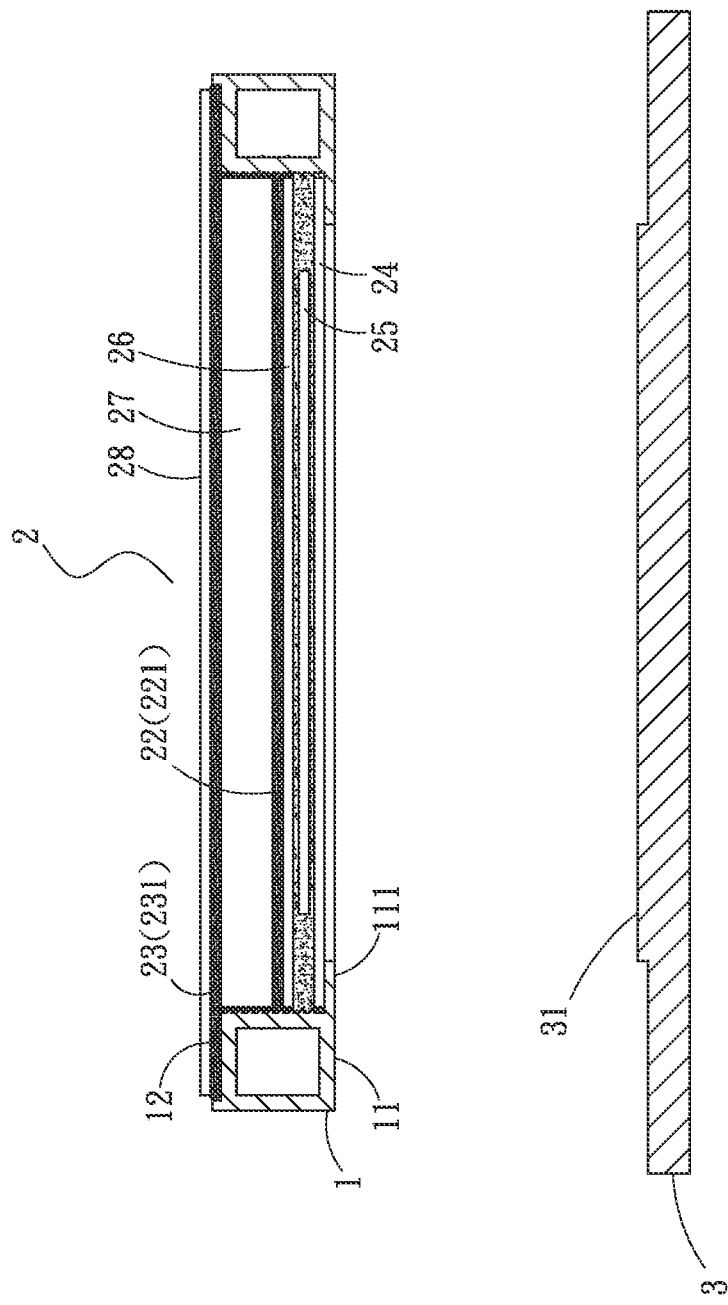
[Fig 7]

PHOTOVOLTAIC PANEL PACKAGING STRUCTURE AND METHOD FOR THE SAME

BACKGROUND OF THE INVENTION

1. Field of the Invention

The invention relates to a photovoltaic panel packaging technique, and more particularly, to a photovoltaic panel packaging structure and method for the same that reduces the weight and thickness by eliminating glass panel while simplifying the assembly process.

2. Description of the Prior Art

With the rise of environmental awareness, the gradual depletion of other energy sources, and the strong promotion of green energy by government agencies, solar photovoltaic modules will be extensively used in the future. However, these modules actually contain a significant amount of heavy metals. Therefore, it is important to dismantle and recycle discarded solar photovoltaic modules to avoid causing severe environmental pollution.

Taking the structure of traditional silicon crystalline solar modules as an example, it consists of solar cells made of polycrystalline or monocrystalline silicon, copper ribbon interconnecting the solar cells, an encapsulant that seals and secures the solar cells and copper ribbon, a backsheet, a glass substrate, a metal frame that encloses the solar module and connects it to the installation site, and a junction box that integrates and transmits the electric power. The metal frame and junction box can be easily dismantled and recycled, while the remaining structure is securely encapsulated by the encapsulant and requires special treatment to be further dismantled.

Many solar cell modules use glass panels, which have a certain thickness. This causes the path of light entering the solar module to increase continuously through multiple reflections, leading to a decrease in light capture efficiency. Although some companies have developed structures that increase light capture efficiency in solar cell modules, such as those disclosed in Taiwan Patent Publication No. 201526269 entitled "Protective Backsheet for Solar Cell Module and Method for Manufacturing the Same," Taiwan Patent Gazette No. 1707773 entitled "Backsheet for Solar Cells and Method for Manufacturing the Same," Taiwan Patent Gazette No. M490116 entitled "Solar Cell Module," and Taiwan Patent Gazette No. 1612684 entitled "Solar Panel Module and Method for Manufacturing the Same". However, after reviewing in details, one can realize that the manufacturing and assembly processes involved are more complex, resulting in increased production costs and difficulties in recycling.

Another example is that disclosed in Taiwan Patent Gazette No. 1769951 entitled "Packaging Structure for Solar Photovoltaic Panel" filed by the current applicant. The characteristics of this patent include: solar cells of a solar photovoltaic array are housed in receiving grooves of a reflective plate. There are reflective ribs between the receiving grooves. A light transmissive first encapsulating layer encloses the solar photovoltaic array and is respectively bonded to a light transmissive plate and the reflective plate. A second encapsulating layer is respectively bonded to a support plate and a reflective sheet. As a result, light incident on the reflective plate is reflected by the reflective ribs onto neighboring solar cells, the first encapsulating layer, and the light transmissive plate. It then reflects off the first encapsulating layer and the light transmissive plate to reach the solar cells, achieving a structure that does not use glass panels. This reduces weight and thickness, shortens the light reflection path, increases incident light diffusion capability, and in turn enhances light trapping effect to increase power generation. However, the manufacturing and assembly process of this patent requires two encapsulation processes. Therefore, in view of the aforementioned drawbacks and in order to further improve and optimize the technology of the approved patent, the applicant has researched and developed an improved solution, resulting in the present invention.

SUMMARY OF THE INVENTION

One main objective of the present invention is to provide a photovoltaic panel packaging structure and method for the same that does not use glass panels, reducing weight and thickness.

Another objective of the present invention is to provide a photovoltaic panel packaging structure and method for the same that simplifies the assembly process.

Yet another objective of the present invention is to provide an improved frame structure that allows the photovoltaic panel to be quickly separated from the outer frame during recycling and dismantling. This is achieved by applying heat and pressure, facilitating a rapid and simplified dismantling process.

In order to achieve the above objectives and effects, a structure employed by the present invention may include a frame and a solar photovoltaic panel.

The frame may include a first frame surface and a second frame surface with a receiving space formed therein. Inner wall surfaces of the frame may be provided with grooves, and a first stop portion may extend adjacent to the first frame surface.

The solar photovoltaic panel may be placed in the receiving space and abutting against the first stop portion. The solar photovoltaic panel may include a first encapsulating layer, a second encapsulating layer, and a third encapsulating layer. The first encapsulating layer may have a plurality of engaging strips extending along the edges of the solar photovoltaic pane. The engaging strips may be respectively embedded in the corresponding grooves to hold the solar photovoltaic panel in place in the frame, the second encapsulating layer filling the gap between the solar photovoltaic panel and the frame. The third encapsulating layer extending to connect to the second frame surface.

As a result, weight and thickness can be reduced while reducing multiple packaging passes and simplifying the assembly process.

In order to achieve the above objectives and effects, a method employed by the present invention may include the following steps.

A carrier fixture and a frame may be provided. The frame may include a first frame surface and a second frame surface with a receiving space therein. Then, the frame is placed on the carrier fixture.

Next, materials for a solar photovoltaic panel may be provided, including a light transmissive plate, a first encapsulating film, a solar cell panel, a second encapsulating film, a reflective plate, a third encapsulating film, a support plate, a fourth encapsulating film, and a backsheet. Each layer of the solar photovoltaic panel may be placed sequentially into the receiving space.

Thereafter, heat is applied in a negative vacuum pressure environment to soften the encapsulating films. The first and second encapsulating films, after softening and overflowing, may be joined together to fill the grooves on the inner walls of the frame, forming a first encapsulating layer. Meanwhile, engaging strips embedded in the grooves ma be formed on the edges of the first encapsulating layer. The fourth encapsulating film, after softening and overflowing, may extend to fill the space between the backsheet and the second frame surface to form a third encapsulating layer and engaging strips. The third encapsulating film, after softening and overflowing, may fill the gap between the grooves on the inner walls of the frame, the support plate and the reflective plate to form a second encapsulating layer and engaging strips.

Based on the structure above, the solar photovoltaic panel may include a light transmissive plate, a first encapsulating film, a solar cell panel, a second encapsulating film, a reflective plate, a third encapsulating film, a support plate, a fourth encapsulating film, and a backsheet, wherein the solar photovoltaic panel may be pressured in a vacuum and the encapsulating films are softened, such that the first and second encapsulating films may be joined to form the first encapsulating layer, the third encapsulating film may bond to the reflective plate and the support plate and extend to fill the gap between the solar photovoltaic panel and the frame to form the second encapsulating layer, and the fourth encapsulating film may extend to the second frame surface to form the third encapsulating layer.

Based on the structure above, the reflective plate may be a plate, sheet, or film made of flexible polymer plastic.

Based on the structure above, the light transmissive plate may be a plate, sheet, and film made of light transmissive polymer plastic.

Based on the structure above, the first encapsulating film and the second encapsulating film may be light transmissive ethylene-vinyl acetate (EVA) adhesive.

Based on the structure above, the third encapsulating film and the fourth encapsulating film may be transparent or opaque hot-melt adhesive, thermosetting adhesive, or silicone, and may be pre-made into a plate shape, a sheet shape, or a film shape.

The objectives, effects and features of the present invention can be more fully understood by referring to the drawing as follows:

BRIEF DESCRIPTION OF THE DRAWINGS

FIG. 1 is a sectional view of a preferred embodiment of the present invention.

FIG. 2 is an exploded perspective view of some components of a preferred embodiment of the present invention.

FIG. 3 is a flowchart of a preferred embodiment of the present invention.

FIG. 4 is a schematic diagram I depicting the assembly of a preferred embodiment of the present invention.

FIG. 5 is a schematic diagram II depicting the assembly of a preferred embodiment of the present invention.

FIG. 6 is a schematic diagram III depicting the assembly of a preferred embodiment of the present invention.

FIG. 7 is a schematic diagram IV depicting the assembly of a preferred embodiment of the present invention.

DETAILED DESCRIPTION OF THE PREFERRED EMBODIMENTS

Please refer to FIGS. 1, 2 and 4, the structure of the present invention includes a frame 1, a solar photovoltaic panel 2, and a carrier fixture 3.

The frame 1 has a frame structure consisting of a first frame surface 11 and a second frame surface 12 with a receiving space 10 formed therein. The inner wall surface of the frame 1 is provided with grooves 13. A first stop portion 111 extends adjacent to the first frame surface 11 of the frame 1.

It should be noted that in a preferred embodiment, the frame 1 has a first frame element 14 and a second frame element 15, wherein the first frame element 14 has channels 141 at both ends, and the inner walls of the channels 141 are provided with a first tooth surface (referring to FIG. 3, not labeled in the figure). The second frame element 15 has connecting columns 151 at both ends, and the surfaces of the connecting columns 151 are provided with a second tooth surface 152. The first frame element 14 is connected to the second frame element 15, and the connecting columns 151 are inserted into the channels 141, so that the first tooth surfaces of the channels 141 correspond to the second tooth surfaces 152, allowing the first frame element 14 and the second frame element 15 to be combined to form the frame 1. The combination of the first frame element 14 and the second frame element 15 can be a C-C type, an L-L type, or a C-I type.

The solar photovoltaic panel 2 is placed in the receiving space 10 and abuts against the first stop portion 111. The solar photovoltaic panel 2 has a first encapsulating layer 21, a second encapsulating layer 22, and a third encapsulating layer 23. The first encapsulating layer 21 extends a plurality of engaging strips 211 along the edges of the solar photovoltaic panel 2. The engaging strips 211 are respectively embedded in the corresponding grooves 13 to hold the solar photovoltaic panel 2 in place in the frame 1. The second encapsulating layer 22 fills the gap inside the solar photovoltaic panel 2, and the third encapsulating layer 23 extends and connects to the second frame surface 12.

The solar photovoltaic panel 2 includes a light transmissive plate 24, a first encapsulating film 212, a solar cell panel 25, a second encapsulating film 213, a reflective plate 26, a third encapsulating film 221, a support plate 27, a fourth encapsulating film 231, and a backsheet 28.

The reflective plate 26 is a plate, sheet, or film made of flexible polymer plastic.

The light transmissive plate 24 is a plate, sheet, or film made of light transmissive polymer plastic.

The first encapsulating film 212 and the second encapsulating film 213 are light transmissive ethylene-vinyl acetate (EVA) adhesive, and the third encapsulating film 221 and the fourth encapsulating film 231 are pre-made, plate-shaped, sheet-shaped, or film-shaped hot-melt adhesive, thermosetting adhesive, or silicone.

The surface of the carrier fixture 3 is provided with a convex surface 31. It should be noted that the carrier fixture 3 is an assembly tool for assembling the solar photovoltaic panel 2 to the frame 1. When the present invention is actually assembled on the site, the carrier fixture 3 is not required. That is, the carrier fixture 3 is only used for production and manufacturing purposes.

Referring to FIGS. 4 to 7, when the above structure is assembled, the first surface of the frame 1 is in contact with the carrier fixture 3, and the convex surface 13 is fitted into the first stop portion 111 of the frame 1, so that a close fit is formed between the frame 1 and the carrier fixture 3, and the frame 1 is held in place on the carrier fixture 3.

Next, each layer of the solar photovoltaic panel 2 is sequentially placed into the receiving space 10, in the following order: the light transmissive plate 24, the first encapsulating film 212, the solar cell panel 25, the second encapsulating film 213, the reflective plate 26, the third encapsulating film 221, the support plate 27, the fourth encapsulating film 231, and the backsheet 28. The bottom layer (it should be noted that the "bottom layer" in this specification is described according to the stacking order in the figure, that is, the first structure placed in the receiving space 10, namely, the light transmissive plate 24) will rest on the first stop portion 111 of the frame 1, and at the same time, the edges of the light transmissive plate 24, the first encapsulating film 212, the second encapsulating film 213, and the reflective plate 26 will be adjacent to the corresponding grooves 13 of the frame 1.

Then, under negative vacuum pressure, the encapsulating films 212, 213, 221 and 231 are heated. The first encapsulating film 212 and the second encapsulating film 213 are softened and overflow to join and form the first encapsulating layer 21. At the same time, the first encapsulating layer 21 continues to extend and fill the grooves 13 on the inner wall of the frame 1, forming the engaging strips 211 embedded in the grooves 13 at the edges of the first encapsulating layer 21. The third encapsulating film 221 is softened to overflow and fill the gap between the inner walls of the frame 1, the supporting plate 27, and the reflecting plate 26, forming the second encapsulating layer 22. The fourth encapsulating film 231 is softened and overflow to fill the gap between the backsheet 28 and the second frame surface 12, forming the third encapsulating layer 23.

Once the first encapsulating layer 21 (the encapsulating films 212 and 213), the second encapsulating layer 22 (the third encapsulating film 221), and the third encapsulating layer 23 (the fourth encapsulating film 231) are cured, the carrier fixture 3 can be removed to complete the assembly of the structure of the present invention.

Referring to FIGS. 4 to 7, some components can be understood by referring to the flowchart shown in FIG. 3. The method for packaging the photovoltaic panel of the present invention includes the following steps:

(100) A carrier fixture is provided.
(101) A frame with a first frame surface and a second frame surface having a receiving space therein is provided.
(102) The frame is placed on the carrier fixture.

In the step above, the first frame surface 11 of the frame 1 is brought into contact with the carrier fixture 3, so that the convex surface 31 of the carrier fixture 3 is fitted into the first stop portion 111 to form a close fit between the frame 1 and the carrier fixture 3, firmly holding the frame 1 in place on the carrier fixture 3.

(103) A light transmissive plate, a first encapsulating film, a solar cell panel, a second encapsulating film, a reflective plate, a third encapsulating film, a supporting plate, a fourth encapsulating film, and a backsheet are provided, and sequentially placed in the receiving space.

In the step above, the light transmissive plate 24 that is placed first will be brought into contact with the first stop portion 111 of the frame 1. Meanwhile, the edges of the light transmissive plate 24, the first encapsulating film 212, the second encapsulating film 213, and the reflective plate 26 are respectively assembled corresponding to the grooves 13 adjacent to the frame 1.

(104) A negative vacuum pressure environment is provided and heat is applied to soften the encapsulating films.

During the above step, applying heat to soften the encapsulating films (including the first encapsulating film 212, the second encapsulating film 213, the third encapsulating film 221, and the fourth encapsulating film 231) in the chamber of a vacuum heating equipment. A preferred heating temperature is between about 120° C. and 160° C. After the encapsulating films 212, 213, 221 and 231 are heated and softened, the chamber is evacuated, such that there is a negative pressure inside the chamber and positive pressure outside of it. The negative vacuum pressure inside the chamber causes all the aforementioned materials to naturally combine together, and the steps of pressurization and positioning are carried out at the same time. It should be noted that the vacuum heating equipment in this embodiment, such as vacuum laminator and other equipment, is not a technical feature of the present disclosure, and is a public and well-established technology in the industry. Here, only a brief description of a preferred implementation and application of simultaneous heating, pressurization and positioning in the steps of the method of the present invention is given, it is not intended to limit the use of a specific type of equipment in step (104).

(105) The first and second encapsulating film are softened to become connected and fill the grooves on the inner walls of the frame.
(106) The first encapsulating layer is formed and the engaging strips are formed at the edges of the first encapsulating layer.
(107) The third encapsulating film is softened to fill the gap between the grooves on the inner walls of the frame, the support plate and the reflective plate, forming the second encapsulating layer and the engaging strips.
(108) The fourth encapsulating film is softened to extend and fill the space between the backsheet and the second frame surface, forming the third encapsulating layer and the engaging strips.

When the above step is carried out, the first encapsulating film 212 and the second encapsulating film 213 are softened into fluid form to become connected, forming the first encapsulating layer 21. At the same time, the first encapsulating layer 21 continues to extend to fill the grooves 13 on the inner walls of the frame 1, form the engaging strips 21 embedded in the grooves 13 at the edges of the first encapsulating layer 21. The third encapsulating film 221 is softened to fill the gap between the inner walls of the frame 1, the support plate 27 and the reflective plate 26 to form the second encapsulating layer 22. Meanwhile, the fourth encapsulating film 231 is softened to extend and fill the space between the backsheet 28 and the second frame surface 12 to form the third encapsulating layer 23. According to the above steps and structure, the photovoltaic panel packaging structure and the method for the same in accordance with the present disclosure are provided.

Based on the above, the photoelectric panel packaging structure and method for the same of the present invention not only reduces the weight and thickness by eliminating the use of glass plates, but also can simplify the assembly process. At the same time, when the present invention is recycled and disassembled, it can be heated and then pressurized to quickly separate the photovoltaic panel body from the outer frame, simplifying the disassembly process. In view of the above, the present invention is submitted to be novel and non-obvious and a patent application is hereby filed in accordance with the patent law. It should be noted that the descriptions given above are merely descriptions of preferred embodiments of the present invention, various changes, modifications, variations or equivalents can be made to the invention without departing from the scope or spirit of the invention. It is intended that all such changes, modifications and variations fall within the scope of the following appended claims and their equivalents.

What is claimed is:

1. A photovoltaic panel packaging structure comprising:
a frame including a first frame surface and a second frame surface with a receiving space formed therein, inner wall surfaces of the frame are provided with grooves, and a first stop portion extending adjacent to the first frame surface; and
a solar photovoltaic panel placed in the receiving space and abutting against the first stop portion, the solar photovoltaic panel including a first encapsulating layer, a second encapsulating layer, and a third encapsulating layer, the first encapsulating layer having a plurality of engaging strips extending along the edges of the solar photovoltaic panel, the engaging strips being respectively embedded in the grooves of the inner wall surfaces of the frame to hold the solar photovoltaic panel in place in the frame, the second encapsulating layer filling a gap between the solar photovoltaic panel and the frame, and the third encapsulating layer extending to connect to the second frame surface.

2. The photovoltaic panel packaging structure of claim 1, wherein the solar photovoltaic panel includes a light transmissive plate, a first encapsulating film, a solar cell panel, a second encapsulating film, a reflective plate, a third encapsulating film, a support plate, a fourth encapsulating film, and a backsheet, wherein the solar photovoltaic panel is pressured in a vacuum and the first encapsulating film, the second encapsulating film, the third encapsulating film, and the fourth encapsulating film are softened, such that
the first and second encapsulating films are connected to form the first encapsulating layer,
the third encapsulating film adheres to the reflective plate and the support plate and extends to fill the gap between the solar photovoltaic panel and the frame to form the second encapsulating layer, and
the fourth encapsulating film extends to the second frame surface to form the third encapsulating layer.

3. The photovoltaic panel packaging structure of claim 2, where the reflective plate is at least one selected from the group consisting of a plate, sheet, and film made of flexible polymer plastic.

4. The photovoltaic panel packaging structure of claim 2, where the light transmissive plate is at least one selected from the group consisting of a plate, sheet, and film made of light transmissive polymer plastic.

5. The photovoltaic panel packaging structure of claim 2, wherein the first encapsulating film and the second encapsulating film are light transmissive ethylene-vinyl acetate (EVA) adhesive.

6. The photovoltaic panel packaging structure of claim 2, wherein the third encapsulating film and the fourth encapsulating film are transparent or opaque hot-melt adhesive, thermosetting adhesive, or silicone, and are pre-made into a plate shape, a sheet shape, or a film shape.

7. A photovoltaic panel packaging method comprising:
providing a carrier fixture;
providing a frame including a first frame surface and a second frame surface with a receiving space therein;
placing the frame on the carrier fixture;
providing a light transmissive plate, a first encapsulating film, a solar cell panel, a second encapsulating film, a reflective plate, a third encapsulating film, a support plate, a fourth encapsulating film, and a backsheet, and placing them sequentially into the receiving space;
providing a negative vacuum pressure environment and applying heat to soften the encapsulating films;
the first and second encapsulating film are softened to become connected and fill grooves on inner walls of the frame;
a first encapsulating layer is formed, and engaging strips are formed at edges of the first encapsulating layer;
the third encapsulating film, after softening and overflowing, filling a gap between the grooves on the inner walls of the frame, the support plate and the reflective plate to form a second encapsulating layer and engaging strips; and
the fourth encapsulating film, after softening and overflowing, extending to fill the space between the backsheet and the second frame surface to form a third encapsulating layer and engaging strips.

8. The photovoltaic panel packaging method of claim 7, where the reflective plate is at least one selected from the group consisting of a plate, sheet, and film made of flexible polymer plastic.

9. The photovoltaic panel packaging method of claim 7, where the light transmissive plate is at least one selected from the group consisting of a plate, sheet, and film made of light transmissive polymer plastic.

10. The photovoltaic panel packaging method of claim 7, wherein the first encapsulating film and the second encapsulating film are light transmissive ethylene-vinyl acetate (EVA) adhesive.

11. The photovoltaic panel packaging method of claim 7, wherein the third encapsulating film and the fourth encapsulating film are transparent or opaque hot-melt adhesive, thermosetting adhesive, or silicone, and are pre-made into a plate shape, a sheet shape, or a film shape.

* * * * *